United States Patent [19]
Han

[11] Patent Number: 6,150,605
[45] Date of Patent: Nov. 21, 2000

[54] PHOTOVOLTAIC CELL AND MANUFACTURING METHOD THEREOF

[75] Inventor: Liyuan Han, Yamatotakada, Japan

[73] Assignee: Sharp Kabushiki Kaisha, Osaka, Japan

[21] Appl. No.: 09/400,862

[22] Filed: Sep. 21, 1999

[30] Foreign Application Priority Data

Sep. 22, 1998 [JP] Japan ................... 10-267516

[51] Int. Cl.7 .......... H01L 31/103; H01L 31/18; H01L 31/055; H01M 14/00
[52] U.S. Cl. .......... 136/263; 136/255; 136/256; 136/249; 257/440; 257/461; 257/432; 257/40; 438/74; 438/70; 438/82; 438/67; 438/99
[58] Field of Search .................. 136/263, 255, 136/256, 249 TS; 257/440, 461, 432, 40; 438/74, 70, 82, 67, 99

[56] References Cited

U.S. PATENT DOCUMENTS

| | | | |
|---|---|---|---|
| 3,009,006 | 11/1961 | Kostelec | 136/263 |
| 4,190,950 | 3/1980 | Skotheim | 438/69 |
| 4,212,932 | 7/1980 | Calgari et al. | 136/263 |
| 5,885,368 | 3/1999 | Lupo et al. | 136/263 |
| 6,028,265 | 2/2000 | One et al. | 136/263 |

FOREIGN PATENT DOCUMENTS

| | | |
|---|---|---|
| 2664194 B2 | 6/1997 | Japan . |
| 91/16719 | 10/1991 | WIPO . |
| 94/05025 | 3/1994 | WIPO . |

*Primary Examiner*—Alan Diamond
*Attorney, Agent, or Firm*—Nixon & Vanderhye

[57] ABSTRACT

A photovoltaic cell has a structure including a first electrode layer, a first photovoltaic layer, an electrically conductive layer, a second photovoltaic layer and a second electrode layer that are successively laminated, wherein the first photovoltaic layer is a semiconductor film containing a first colorant, the second photovoltaic layer is a semiconductor film containing a second colorant, the first colorant and the second colorant being different from each other, so that the first photovoltaic layer and the second photovoltaic layer have different photocurrent action spectra.

12 Claims, 2 Drawing Sheets

PHOTOVOLTAIC CELL AND MANUFACTURING METHOD THEREOF

CROSS-REFERENCES TO RELATED APPLICATIONS

This application is related to Japanese patent application No. HEI 10-267516 filed on Sep. 22, 1998 whose priority is claimed under 35 USC §119, the disclosure of which is incorporated herein by reference in its entirety.

BACKGROUND OF THE INVENTION

1. Field of the Invention

The present invention relates to a photovoltaic cell which is typically used as a solar cell and a manufacturing method thereof.

2. Description of the Related Art

As an alternative energy source to a fossil fuel, a solar cell utilizing sunlight is attracting people's attention, and various studies have been conducted thereon. Prevailing solar cells that are now in practical use are those made of polycrystalline or amorphous silicon. However, these kinds of solar cells have problems that the economic costs and energy costs in a manufacturing process are high, and also a highly toxic material such as gallium or arsenic is used.

Japanese Unexamined Patent Publications Nos. SHO 58(1983)-188169, SHO 59(1984)-124772 and HEI 01(1989)-289173 disclose silicon type solar cells having different absorption spectra which are laminated on a single substrate. However, none of the solar cells disclosed in the above-mentioned publications could solve the above-mentioned problems.

On the other hand, Japanese Unexamined Patent Publication No. HEI 05(1993)-504023 (International Publication No. WO 9116719), Japanese Patent Publication No. 2664194 and International Publication No. WO 9405025 disclose new wet-type solar cells utilizing an optically induced electron movement of a metal complex.

These wet-type solar cells are constructed with a semiconductor electrode, a counter electrode and an electrolyte layer sandwiched between these electrodes. The semiconductor electrode includes an electrode and a semiconductor layer made of a photovoltaic raw material. A photosensitizing colorant having an absorption spectrum in a visible light region is adsorbed on a surface of the semiconductor layer.

In these wet-type solar cells, when the semiconductor electrode is irradiated with light, electrons are generated on this semiconductor electrode's side and moved via an electric circuit to the counter electrode. The electrons moved to the counter electrode are carried by ions in the electrolyte and return to the semiconductor electrode. This process is repeated to allow an electric energy to be taken out.

However, since the photosensitizing colorant as used has a limited light absorption range, it is not possible to effectively utilize sunlight in the range from visible light to near infrared light. Therefore, it is difficult to obtain such a high conversion efficiency as a silicon type solar cell can provide.

Also, International Publication No. WO 9405025 discloses the use of two colorants and a fluorescent brightener as spectroscopic sensitizing colorants on the surface of a metal oxide semiconductor. Use of two kinds of colorants allows more effective utilization of sunlight. However, if two kinds of colorants are allowed to be adsorbed simultaneously in a colorant adsorption step of a manufacturing process, it is difficult to quantitatively control the amount of adsorption, because the speed of adsorption on a metal oxide semiconductor differs depending on the kind of the colorants.

SUMMARY OF THE INVENTION

An object of the present invention is to provide a photovoltaic cell of a novel structure having a high photovoltaic conversion efficiency.

Accordingly, the present invention provides a photovoltaic cell having a structure including a first electrode layer, a first photovoltaic layer, an electrically conductive layer, a second photovoltaic layer and a second electrode layer that are successively laminated, wherein the first photovoltaic layer is a semiconductor film containing a first colorant, the second photovoltaic layer is a semiconductor film containing a second colorant, the first colorant and the second colorant being different from each other, so that the first photovoltaic layer and the second photovoltaic layer have different photocurrent action spectra.

Also, the present invention provides a method of manufacturing a photovoltaic cell, comprising the steps of: forming a first electrode layer on a first substrate; forming a first semiconductor film on the first substrate having the first electrode layer formed thereon; allowing the first semiconductor film to contain a first colorant to form a first photovoltaic layer; forming a second electrode layer on a second substrate; forming a second semiconductor film on the second substrate having the second electrode layer formed thereon; allowing the second semiconductor film to contain a second colorant to form a second photovoltaic layer; placing first and second substrates so that the first photovoltaic layer and the second photovoltaic layer are faced to each other; and forming an electrically conductive layer between the first and second photovoltaic layers.

Further, the photovoltaic cell of the present invention can be effectively used as a solar cell.

BRIEF DESCRIPTION OF THE DRAWINGS

The present invention will be better understood from the following detailed description of preferred embodiments of the invention, taken in conjunction with the accompanying drawings, in which.

DETAILED DESCRIPTION OF THE PREFERRED EMBODIMENTS

Figure 1:
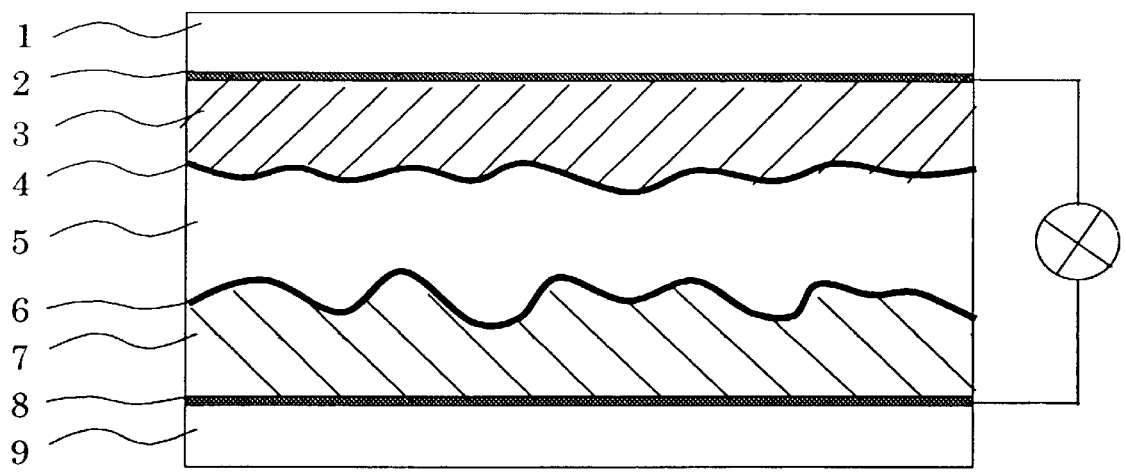
FIG. 1 is a model view showing a photovoltaic cell formed according to the present invention.

In the present invention, a photovoltaic cell includes a first electrode, a first photovoltaic layer, an electrically conductive layer, a second photovoltaic layer and a second electrode that are successively laminated in this order.

In the present invention, the first and second electrodes may be made, for example, of a metal such as gold, silver, aluminum or indium, or an oxide such as indium tin oxide (ITO film) or tin oxide. In this case, at least one of the first and second electrodes should be transparent. The first and second electrodes are formed on a first substrate and a second substrate, respectively. Examples of the first and second substrates include a glass plate or a transparent plastic sheet. Alternatively, the first and second electrodes may be metal substrates themselves. In the former case, the first and second electrodes may be formed on the substrate, for example, by vapor deposition method.

The two photovoltaic layers used in the present invention may be made of any material as long as it is generally used as a photovoltaic raw material. For example, the photovoltaic layers may be made of an inorganic semiconductor, an organic semiconductor or the like.

In the present invention, the first and second photovoltaic layers have different photocurrent action spectra in order to utilize a wider wavelength range of light. Also, in the present invention, colorants (e.g. pigment, dye) are used as photosensitizers in order to increase the sensitivity to light, when an inorganic semiconductor such as a metal oxide is used. Preferably, one of the first and second photovoltaic layers is a p-type semiconductor and the other is an n-type semiconductor.

The n-type semiconductor used in the present invention may be, for example, a known inorganic semiconductor such as titanium oxide, zinc oxide, tungsten oxide, barium titanate, strontium titanate or cadmium sulfide, or a combination of two or more of these. The p-type semiconductor used in the present invention may be, for example, a known inorganic semiconductor such as copper oxide, nickel oxide, cobalt oxide, manganese oxide, chromium oxide, or a combination of two or more or these.

In the photovoltaic cell of the present invention, it is preferable that the photovoltaic layer on the light-receiving side of the photovoltaic cell has a light transmittance of at least 60%, more preferably more than 80%, in a photosensitive wavelength region of the opposite photovoltaic layer so that the light can reach the photovoltaic layer on the opposite side.

Preferably, the semiconductor layer is a porous semiconductor film, which has a large specific surface area and can contain a larger amount of the colorant.

The semiconductor film can be formed on the substrate by various known methods. Specifically, it is possible to use a method in which a suspension containing semiconductor particles is applied on a substrate, followed by drying and/or sintering; a method in which a semiconductor film is formed on a substrate by CVD or MOCVD method using necessary material gases. Other usable method are PVD method using a solid raw material, vapor deposition method, sputtering method, sol-gel method or the like. The thickness of the semiconductor film to be formed is preferably from 0.3 $\mu$m to 50 $\mu$m.

The semiconductor particles may be commercially available semiconductor particles of a single element or a compound having a suitable average particle size, for example, within the range of 1 nm to 2000 nm. These semiconductor particles can be suspended in an appropriate solvent for use. Such solvent includes a glyme solvent such as ethylene glycol monoethyl ether, an alcohol such as isopropyl alcohol, a mixed solvent such as isopropyl alcohol/toluene, a mixed solvent of the above-mentioned solvents and water, or the like.

The suspension of the semiconductor particles is applied onto the substrate and dried and/or sintered. The temperature, time, atmosphere or the like required for the drying and sintering steps can be suitably adjusted depending on the kinds of the substrate, the solvent and the semiconductor particles used. For example, the drying and sintering steps may be carried out under an ambient atmosphere or an inert gas atmosphere in the temperature range of 50° C. to 800° C. for 10 seconds to 12 hours. The drying and sintering steps may be carried out at a certain temperature once, or alternatively twice or more times in different temperatures.

The material gas used in the CVD method for forming the semiconductor film may be a single gas containing an element constituting the semiconductor or a mixture of two or more kinds of gases. The solid raw material used in the PVD method for forming the semiconductor film may be a solid single element, a solid compound containing the element constituting the semiconductor or a combination of a plural solids.

In order to improve the conversion efficiency of the photovoltaic cell, a colorant is allowed to be contained in the semiconductor film which shall be understood to imply the adsorption on the surface of the semiconductor film. The colorant may be selected from a variety of colorants having absorption spectra in the visible light region and/or the infrared light region.

For example, the colorant may be an azo colorant, a quinone colorant, a quinonimine colorant, a quinacridone colorant, a squarylium colorant, a cyanine colorant, a merocyanine colorant, a triphenylmethane colorant, a xanthene colorant, a porphyrin colorant, a phthalocyanine colorant, a perylene colorant, an indigo colorant, a naphthalocyanine colorant or the like. Among these, a metal complex colorant such as a phthalocyanine colorant or naphthalocyanine colorant is preferable as a good photosensitising material since it has a high quantum yield and good durability against light.

Here, examples of the metals involved in the metal complex colorant include, Cu, Ni, Fe, Co, V, Sn, Si, Ti, Ge, Cr, Zn, Ru, Mg, Al, Pb, Mn, In, Mo, Y, Zr, Nb, Sb, La, W, Pt, Ta, Ir, Pd, Os, Ga, Tb, Eu, Rb, Bi, Se, As, Sc, Ag, Cd, Hf, Re, Au, Ac, Tc, Te, Rh or the like. A metal complex colorant using a metal such as Cu, Ti, Zn, Al, Fe, V, Si or the like has a high quantum yield.

In the present invention, the colorant preferably has at least one interlocking group in its molecule so that the colorant can be strongly adsorbed on the surface of the semiconductor. The interlocking group can provide an electric bonding which facilitates electron movement between the colorant in an excited state and a conduction band of a semiconductor. The interlocking group is preferably selected from the group consisting of carboxyl group, alkoxy group, hydroxyalkyl group, hydroxyl group, sulfonic acid group, mercapto group, phosphonyl group, phosphono group, ester group and the like.

In order to utilize a wider wavelength region of light, it is particularly preferable to use different colorants. Preferably, the maximum absorption wavelength of the first colorant in the first photovoltaic layer and the maximum absorption wavelength of the second colorant in the second photovoltaic layer are different from each other. Representative combinations of colorants may be a combination of a phthalocyanine colorant having a maximum absorption wavelength of 650 nm to 900 nm or 630 nm to 800 nm and a perylene colorant having a maximum absorption wavelength of 400 nm to 650 nm or 450 nm to 600 nm.

In addition, a treatment for activating the surface of the semiconductor film may be carried out in accordance with the needs before allowing the colorant to be contained onto the surface of the semiconductor film.

The colorant may be allowed to be contained onto the semiconductor film by immersing the semiconductor film in a solution or suspension containing the colorant.

The solvent in the above-mentioned solution or suspension is not specifically limited as long as it can dissolve or disperse the colorant used. Examples of the solvents include organic solvents such as alcohols, toluene, acetonitrile, chloroform, dimethylsulfoxide and dimethylformamide. Preferably the solvent is a purified one. The concentration of the colorant in the solvent may be suitably adjusted in accordance with the kind of the colorant, solvent and the like. The colorant is preferably contained at a concentration of not less than $1 \times 10^{-5}$ mol/liter.

The temperature, pressure and immersion time may be varied in accordance with the needs at the step of immersing the semiconductor film in the liquid containing the colorant. The immersion step may be carried out either once or a plurality of times. Further, the semiconductor film may be dried appropriately after the immersion step. The colorant thus contained in the semiconductor film can act as a photosensitizer that can be excited to generate electrons and holes by means of light energy.

In the photovoltaic cell of the present invention, the electrically conductive film to be sandwiched between the semiconductor layers is composed of an electrically conductive material. The electrically conductive material may be made of any of the materials that can transport electrons, holes or ions. For example, the electrically conductive material may be made of a hole-transporting material such as polyvinylcarbazole, an electron transporting material such as tetranitrofluorenone, an electrically conductive polymer such as polypyrrole and an ion conductor such as a liquid electrolyte or a solid polymer electrolyte.

In the present invention, the liquid electrolyte may contain a redox species such as an $I^-/I^{3-}$ species, a $Br^-/Br^{3-}$ species, a $Fe^{+2}/Fe^{+3}$ species, a quinone/hydroquinone species or the like. Such a redox species may be obtained by a conventionally known method. For example, the $I^-/I^{3-}$ redox species is obtained by mixing iodine with a lithium salt of iodine. A solvent for the liquid electrolyte may be an electrochemically inactive one, such as acetonitrile, propylene carbonate, ethylene carbonate or the like.

Next, the solid polymer electrolyte may be a solid substance that can contain a redox species therein or that can bond to at least one substance constituting the redox species. For example, the solid polymer electrolyte may be a polymer compound such as polyethylene oxide, polypropylene oxide, polyethylene succinate, poly-β-propiolactone, polyethyleneimine, polyalkylene sulfide or a cross-linked compound thereof, a compound in which a polyether segment or an oligoalkylene oxide structure is added as a side chain to a polymer functional group such as polyphosphazene, polysiloxane, polyvinyl alcohol, polyacrylic acid or polyalkylene oxide, or a copolymer thereof. Among these, those having an oligoalkylene oxide structure as a side chain or having a polyether segment as a side chain are preferable.

In order to allow a redox species to be contained in the solid, it is possible to adopt a method in which polymerization is carried out in the copresence of a monomer of the polymer compound and a redox species, or a method in which a solid such as a polymer compound is dissolved in a solvent in accordance with the needs and then the above-mentioned redox species is added, followed by removal of the solvent. The content of the redox species can be suitably selected in accordance with the required ion conductivity.

Figure 2:
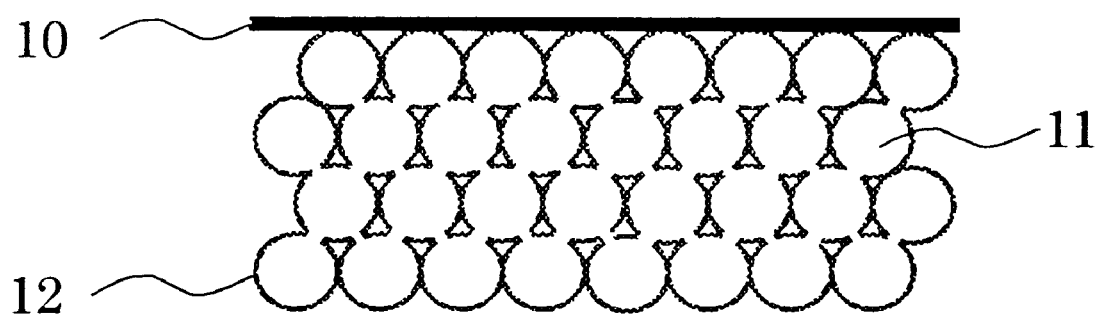
FIG. 2 is a model view of a first photovoltaic layer and a second photovoltaic layer in FIG. 1.

The photovoltaic cell of the present invention is applied to devices such as a solar cell, an optical switching element, a sensor or the like. According to the present invention, a solar cell as shown in FIG. 1, for example, is provided. In FIG. 1, supporters 1, 9, a transparent electrically conductive film (first electrode) 2, a first semiconductor film (first photovoltaic layer) 3, colorants 4, 6, an electrically conductive layer 5, a second semiconductor film (second photovoltaic layer) 7, and a transparent electrically conductive film (second electrode) 8 are shown. When sunlight is applied to the colorant in the solar cell, the colorant absorbs the light to be raised to an excited state. Electrons and holes generated by this excitation move to respective semiconductor films and then move via the transparent electrically conductive film to the counter electrode. On the other hand, the electrons remaining in the colorant inside the solar cell return to the colorant of the opposing side through the intermediary of the redox species in the electrolyte. Through such a process, electric currents are generated, whereby the light energy is continuously converted into electric energy. FIG. 2 is a model view of the first photovoltaic layer and the second photovoltaic layer. In FIG. 2, an electrode 10, a porous semiconductor film 11 and a colorant 12 are shown.

EXAMPLES

The photovoltaic cell of the present invention will be hereafter described by way of the following Examples, which are not intended to limit the scope of the present invention.

Example 1

(the case where the electrically conductive layer is made of a liquid electrolyte)
(1) Forming a first photovoltaic layer By means of a paint shaker using hard glass beads, 4.0 g of commercially available titanium oxide particles (manufactured by TAYCA Corporation, having an average particle size of 30 nm) and 20 ml of diethylene glycol monomethyl ether were stirred for six hours to prepare a titanium oxide suspension. Thereafter, by means of a doctor blade, the titanium oxide suspension was applied on a glass plate on which an electrically conductive tin oxide layer (first electrode) had been formed in advance. Thereafter, the glass plate was pre-dried at 100° C. for 30 minutes and sintered at a temperature of 500° C. for 40 minutes in an electric furnace to give a titanium oxide film.

Separately from the above, a colorant represented by the following formula (1) [cis-dithiocyanine-N-bis(2,2'-bipyridyl-4,4'-dicarboxylic acid) ruthenium] was dissolved in ethanol.

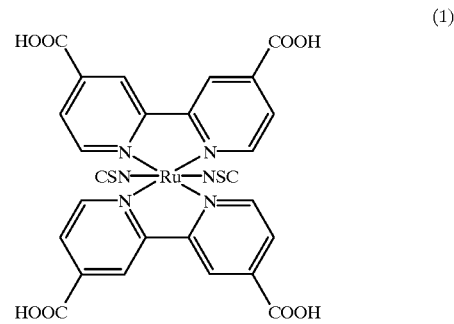

(1)

The concentration of the colorant was $5 \times 10^{-4}$ mol/liter. Then, the above-mentioned glass plate on which film-like titanium oxide had been formed was put into the solution for allowing the colorant to be adsorbed at 60° C. for 60 minutes, followed by drying to give the first photovoltaic layer (Sample A) of the present invention.

(2) Forming a second photovoltaic layer

By means of a paint shaker using hard glass beads, 4.0 g of commercially available nickel oxide particles (manufactured by KISHIDA Chemical Co., Ltd., having an average particle size of 100 nm) and 20 ml of diethylene glycol monomethyl ether were stirred for eight hours to prepare a nickel oxide suspension. Thereafter, by means of a doctor blade, the nickel oxide suspension was applied on a glass plate on which an electrically conductive tin oxide layer (second electrode) had been formed in advance. Thereafter, the glass plate was pre-dried at 100° C. for 30 minutes and sintered at a temperature of 300° C. for 30 minutes to give a nickel oxide film.

Separately from the above, a colorant represented by the following formula (2) [copper tetracarboxyphthalocyanine] was dissolved in dimethyl sulfoxide.

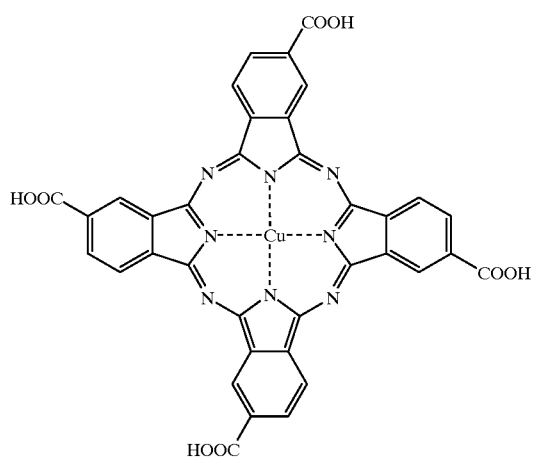

(2)

The concentration of the colorant was $5 \times 10^{-4}$ mol/liter. Then, the above-mentioned glass plate on which film-like nickel oxide had been formed was put into the solution for allowing the colorant to be adsorbed at 70° C. for 60 minutes, followed by drying to give the second photovoltaic layer (Sample B) of the present invention.

(3) The Sample B was positioned above the Sample A. A liquid electrolyte was put between these two electrodes and their sides were sealed with a resin, followed by attachment of a leading wire to prepare the photovoltaic cell (Sample C) of the present invention. Here, the liquid electrolyte had been prepared by dissolving tetrapropylammonium iodide (0.46 mol/liter) and iodine (0.06 mol/liter) in a mixed solvent of acetonitrile/ethylene carbonate (1:4 in volume ratio).

The photovoltaic cell (Sample C) obtained was irradiated with light having an intensity of 1000 W/m² (AM 1.5 solar simulator) and the resultant conversion efficiency was 10.6%. This shows that the photovoltaic cell is useful as a solar cell.

Comparative Example 1
(the case where the electrically conductive layer is made of a liquid electrolyte)

The Sample A was used as one electrode, and a transparent electrically conductive glass plate having platinum carried thereon was used as a counter electrode. A liquid electrolyte was put between the two electrodes and their sides were sealed with a resin, followed by attachment of a leading wire to prepare a photovoltaic cell (Sample D).

The photovoltaic cell (Sample D) obtained was irradiated with light having an intensity of 1000 W/m² (AM 1.5 solar simulator) and resultant conversion efficiency was 6.2%.

Example 2

A photovoltaic cell (Sample E) was obtained in the same manner as in the Example 1 except that a colorant represented by the formula (3) [perylene-3,4-dicarboxylic acid-9,10-(5-phenanthroline)dicarboxylicimide] was used instead of the colorant (2).

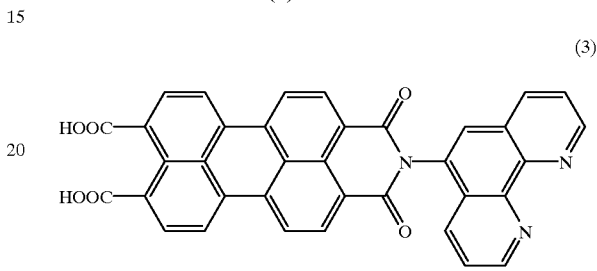

(3)

The photovoltaic cell (Sample E) obtained was irradiated with light having an intensity of 1000 W/m² (AM 1.5 solar simulator) and the resultant conversion efficiency was 7.5%.

Example 3

A photovoltaic cell (Sample F) was obtained in the same manner as in the Example 1 except that a colorant represented by the formula (4) [N,N'-di(4-carboxylphenyl)-3,4,9,10-perylenetetracarboxylic diimide] was used instead of the colorant (2).

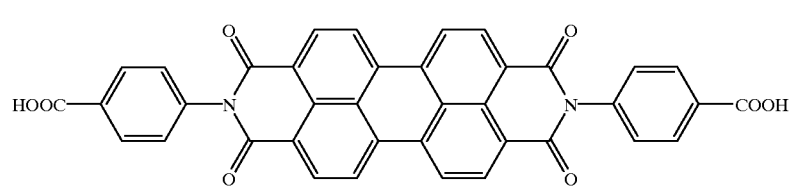

(4)

The photovoltaic cell (Sample F) obtained was irradiated with light having an intensity of 1000 W/m² (AM 1.5 solar simulator) and resultant conversion efficiency was 7.7%.

Example 4
(the case where the electrically conductive layer is made of a solid electrolyte)

A photovoltaic cell (Sample G) was obtained in the same manner as in the Example 1 except that poly [methacrylic acid hexa(ethylene glycol) ether] was used as a solid polymer electrolyte instead of the liquid electrolyte made of acetonitrile/ethylene carbonate.

The photovoltaic cell (Sample G) obtained was irradiated with light having an intensity of 1000 W/m² (AM 1.5 solar simulator) and the resultant conversion efficiency was 2.1%.

Comparative Example 2
(the case where the electrically conductive layer is made of a solid electrolyte)

A photovoltaic cell (Sample H) was obtained in the same manner as in the Comparative Example 1 except that poly [methacrylic acid hexa(ethylene glycol) ether] was used as a solid polymer electrolyte instead of the liquid electrolyte of acetonitrile/ethylene carbonate.

The photovoltaic cell (Sample H) obtained was irradiated with light having an intensity of 1000 W/m$^2$ (AM 1.5 solar simulator) and the resultant conversion efficiency was 1.2%.

As shown and described above, the photovoltaic layer of the present invention is constructed by preparing two photovoltaic layers on which different colorants are adsorbed, and sandwiching an electrically conductive layer between these two photovoltaic layers. By using colorants having different optical absorption wavelengths, the photovoltaic cell can utilize a wider wavelength range of sunlight. As a result, a low cost photovoltaic cell having an excellent photovoltaic efficiency can be easily obtained.

Although the present invention has fully been described by way of example with reference to the accompanying drawings, it is to be understood that various changes and modifications will be apparent to those skilled in the art. Therefore, unless otherwise such changes and modifications depart from the scope of the invention, they should be construed as being included therein.

What we claim is:

1. A photovoltaic cell having a structure including a first electrode layer, a first photovoltaic layer, an electrically conductive layer, a second photovoltaic layer and a second electrode layer that are successively laminated wherein the first photovoltaic layer is a semiconductor film containing a first colorant, the second photovoltaic layer is a semiconductor film containing a second colorant, the first colorant and the second colorant being different from each other, so that the first photovoltaic layer and the second photovoltaic layer have different photocurrent action spectra, and wherein one of the semiconductor film of the first photovoltaic layer and the semiconductor film of the second photovoltaic layer is a p-type semiconductor film, and the other one is an n-type semiconductor film.

2. The photovoltaic cell of claim 1, wherein the maximum absorption wavelength of the first colorant and the maximum absorption wavelength of the second colorant are different from each other.

3. The photovoltaic cell of claim 1, wherein the semiconductor film of the first photovoltaic layer and/or the semiconductor film of the second photovoltaic layer is(are) a porous semiconductor film(s).

4. The photovoltaic cell of claim 1, wherein the electrically conductive layer is an ion conductive layer.

5. The photovoltaic cell of claim 4, wherein the ion conductive layer contains a redox species.

6. The photovoltaic cell of claim 2, wherein the electrode adjacent the photovoltaic layer containing the colorant having the shorter maximum absorption wavelength is transparent and constitutes a light-receiving surface of the photovoltaic cell.

7. The photovoltaic cell of claim 2, wherein one of the first and second colorants is a colorant having a maximum absorption wavelength of 650 nm to 900 nm, and the other colorant is a colorant having a maximum absorption wavelength of 400 nm to 650 nm.

8. The photovoltaic cell of claim 2, wherein one of the first and second colorants is a phthalocyanine colorant having a maximum absorption wavelength range of 630 nm to 800 nm, and the other colorant is a perylene colorant having a maximum absorption wavelength range of 450 nm to 600 nm.

9. The photovoltaic cell of claim 1, wherein the colorants have a carboxyl group, alkoxy group, hydroxyalkyl group, hydroxy group, sulfonic acid group, mercapto group, phosphonyl group, phosphono group or an ester group.

10. A method of manufacturing a photovoltaic cell, comprising the steps of:

forming a first electrode layer on a first substrate;

forming a first semiconductor film on the first substrate having the first electrode layer formed thereon;

providing a first colorant to the first semiconductor film to form a first photovoltaic layer;

forming a second electrode layer on a second substrate;

forming a second semiconductor film on the second substrate having the second electrode layer formed thereon;

providing a second colorant to the second semiconductor film to form a second photovoltaic layer;

placing the first and second substrates so that the first photovoltaic layer and the second photovoltaic layer are faced to each other; and forming an electrically conductive layer between the first and second photovoltaic layers, wherein on of the semiconductor film of the first photovoltaic layer and the semiconductor film of the second photovoltaic layer is a p-type semiconductor film, and the other one is an n-type semiconductor film.

11. The method of claim 10, wherein the electrically conductive layer formed between the first and second photovoltaic layers comprises a liquid electrolyte.

12. A solar cell comprising the photovoltaic cell according to claim 1.

* * * * *